(12) United States Patent
Li et al.

(10) Patent No.: US 12,100,444 B2
(45) Date of Patent: Sep. 24, 2024

(54) MEMORY

(71) Applicant: CHANGXIN MEMORY TECHNOLOGIES, INC., Hefei (CN)

(72) Inventors: Hongwen Li, Hefei (CN); Weibing Shang, Hefei (CN); Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 156 days.

(21) Appl. No.: 17/838,143

(22) Filed: Jun. 10, 2022

(65) Prior Publication Data

US 2023/0186978 A1 Jun. 15, 2023

(30) Foreign Application Priority Data

Dec. 15, 2021 (CN) .......................... 202111539915.6

(51) Int. Cl.
*G11C 7/00* (2006.01)
*G11C 11/408* (2006.01)
*G11C 11/4091* (2006.01)
*G11C 11/4094* (2006.01)
*G11C 11/4096* (2006.01)
*G11C 11/4097* (2006.01)

(52) U.S. Cl.
CPC ...... *G11C 11/4097* (2013.01); *G11C 11/4087* (2013.01); *G11C 11/4091* (2013.01); *G11C 11/4094* (2013.01); *G11C 11/4096* (2013.01)

(58) Field of Classification Search
CPC ....... G11C 7/1051; G11C 7/22; G11C 7/1072; G11C 7/1006; G11C 7/1066

USPC .......................... 365/189.15, 189.14, 189.16
See application file for complete search history.

(56) References Cited

U.S. PATENT DOCUMENTS

| 6,535,451 B2 | 3/2003 | Sekiguchi et al. |
| 10,497,427 B2 | 12/2019 | Kim et al. |
| 2002/0141228 A1 | 10/2002 | Fujino |
| 2003/0218901 A1* | 11/2003 | Ooishi ................ G11C 11/1673 365/157 |
| 2017/0076773 A1* | 3/2017 | Noguchi ............. G11C 11/1659 |

FOREIGN PATENT DOCUMENTS

GB 2239540 A 7/1991

* cited by examiner

*Primary Examiner* — Son T Dinh
(74) *Attorney, Agent, or Firm* — Syncoda LLC; Feng Ma

(57) ABSTRACT

A memory includes: bit lines (BLs) extending along a first direction and word lines (WLs) extending along a second direction; a read-write control circuit and a plurality of memory modules that are arranged along the first direction, wherein each of the plurality of memory modules includes a memory array and an amplifier array that are arranged along the first direction, the memory array includes at least one memory cell, the amplifier array includes at least one amplification unit, each of the BLs is electrically connected to a first terminal of a corresponding amplification unit, and each of the WLs is electrically connected to a corresponding memory cell; a column selection circuit, wherein the column selection circuit and the read-write control circuit are located on two adjacent sides of the plurality of memory modules as a whole, respectively; m column-select lines (CSLs) extending along the first direction.

16 Claims, 9 Drawing Sheets

MEMORY

CROSS-REFERENCE TO RELATED APPLICATIONS

This application claims priority to Chinese Patent Application No. 202111539915.6 filed on Dec. 15, 2021, the disclosure of which is hereby incorporated by reference in its entirety.

BACKGROUND

A semiconductor memory is composed of many repeated basic memory cells. Each of the basic memory cells generally includes a capacitor and a transistor. In the transistor, a gate is connected to a word line (WL), a drain is connected to a bit line (BL), and a source is connected to the capacitor. A voltage signal on the WL can control the transistor to turn on or off, and then data information stored in the capacitor is read through the BL, or data information is written into the capacitor through the BL for storage.

Semiconductor memories can be classified into non-volatile memories and volatile memories. As a volatile memory, a dynamic random access memory (DRAM) has a high storage density, a high read-write speed, and other advantages. The DRAM is widely used in various electronic systems. DRAMs can be classified into double data rate (DDR) DRAMs, graphics double data rate (GDDR) DRAMs, and low power double data rate (LPDDR) DRAMs.

SUMMARY

Embodiments of the present disclosure relate to the technical field of semiconductors, and in particular, to a memory.

According to some embodiments of the present disclosure, an embodiment of the present disclosure provides a memory, including: BLs extending along a first direction and WLs extending along a second direction; a read-write control circuit and a plurality of memory modules that are arranged along the first direction, wherein each of the plurality of memory modules includes a memory array and an amplifier array that are arranged along the first direction, the memory array includes at least one memory cell, the amplifier array includes at least one amplification unit, each of the BLs is electrically connected to a first terminal of a corresponding amplification unit, and each of the WLs is electrically connected to a corresponding memory cell; a column selection circuit, wherein the column selection circuit and the read-write control circuit are located on two adjacent sides of the plurality of memory modules, respectively; m column-select lines (CSLs) extending along the first direction, wherein each of the CSLs is electrically connected to a control terminal of the amplification unit arranged along the first direction, and m is a positive integer greater than 1; and n electrical connection lines (CLs) extending along a third direction, wherein each of the electrical CLs is configured to electrically connect the column selection circuit and a corresponding CSL, n is a positive integer greater than 1, and n≤m.

BRIEF DESCRIPTION OF THE DRAWINGS

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

Figure 1:
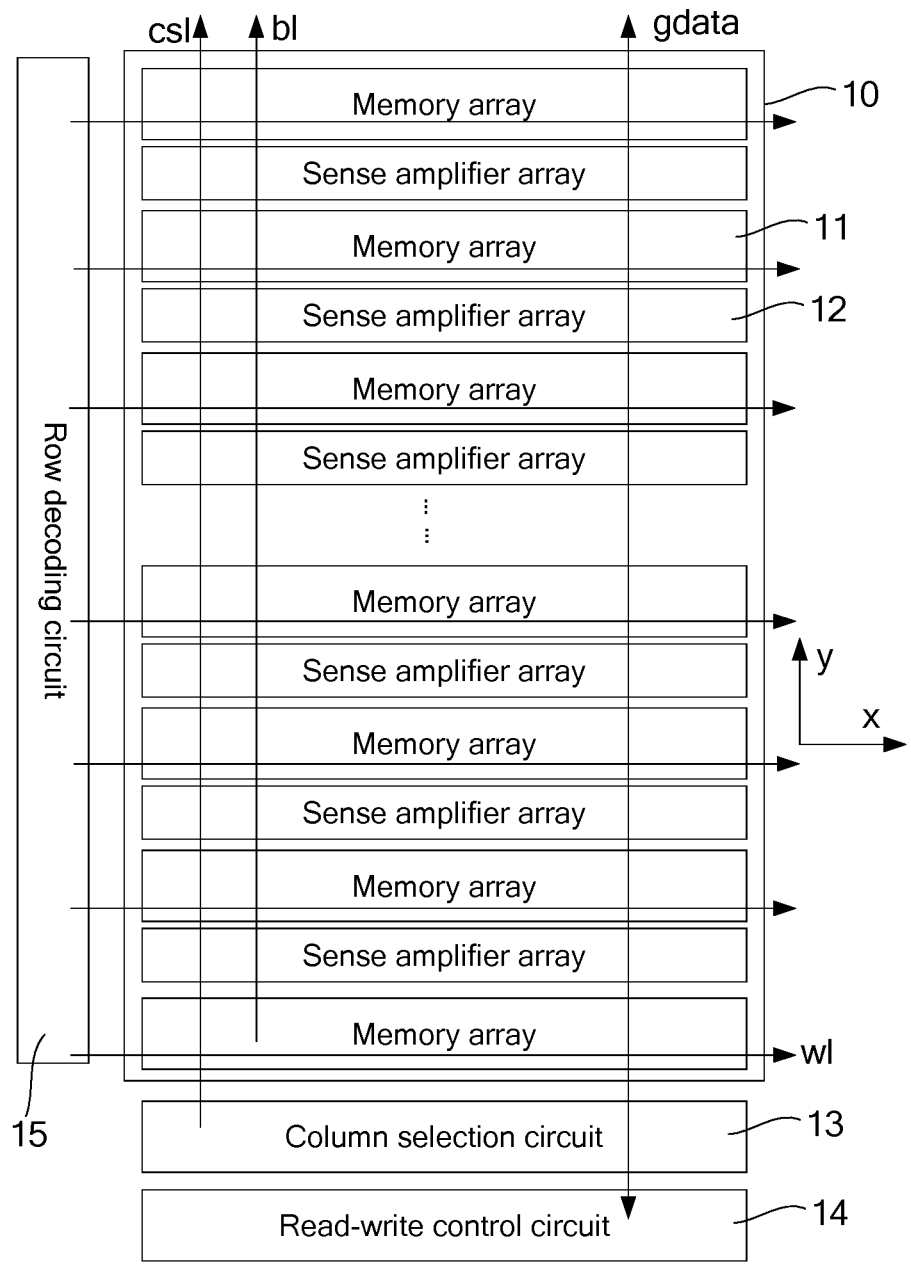
FIG. 1 is a schematic structural diagram of a memory.

FIG. 1 is a schematic structural diagram of a memory. Referring to FIG. 1, the memory includes: a plurality of memory banks 10, wherein each of the plurality of memory banks 10 includes a plurality of memory modules, each of the plurality of memory modules includes a memory array 11 and a sense amplifier array 12, the memory array 11 includes a plurality of memory cells arranged along an x direction, the sense amplifier array 12 includes a plurality of amplification units arranged along the x direction, a memory cell and an amplification unit that are located in a same column constitute a section, and it can be understood that a column is defined to be along a y direction and a row is defined to be along the x direction; a read-write control circuit 14, a column selection circuit (ydec) 13, and a row decoding circuit 15; a plurality of WLs extending along the x direction, wherein each of the plurality of WLs is connected to a memory array 11 of a corresponding row; a plurality of BLs extending along the y direction, wherein each of the plurality of BLs is connected to a memory array 11 of a corresponding column; local read-write conversion circuits, wherein each of the local read-write conversion circuits is located on one side of a corresponding sense amplifier array 12; CSLs extending along the y direction, wherein each of the CSLs is connected to an amplification unit of a sense amplifier array 12 of a corresponding column; and a global data line gdata extending along the y direction, wherein the global data line is electrically connected to the amplification unit and the read-write control circuit 14, and the row decoding circuit 15 is configured to provide a voltage to a WL to enable the WL.

In the above memory, the row decoding circuit 15 is located on one side of each of the plurality of memory banks 10, and the column selection circuit 13 and the read-write control circuit 14 are located on another side of each of the plurality of memory banks 10, which restricts a size and a shape of a chip to a certain extent and affects packaging of the chip or optimization of manufacturing efficiency. Moreover, the column selection circuit 13 includes a plurality of circuit units, and each of the plurality of circuit units is connected to a corresponding section of a same column through the CSL. Therefore, a position of each of the plurality of circuit units corresponds to a position of the corresponding section, and a quantity of the plurality of circuit units is the same as that of sections, which is not conducive to reducing area of the chip and a manufacturing difficulty of the chip.

In addition, in the above memory, RC delays of driving different memory modules by the column selection circuit 13 are quite different. Specifically, the CSL provides a column selection signal, a memory module closest to the read-write control circuit 14 is defined as a first memory module, and a memory module furthest away from the read-write control circuit 14 is defined as a second storage module. A path of transmitting the column selection signal to the first memory module is greatly different from that of transmitting the column selection signal to the second memory module, which causes a large difference between time at which the column selection signal reaches the two memory modules, resulting in a signal delay and affecting normal operation of the memory.

In order to resolve the above problem, embodiments of the present disclosure provide a memory in which a read-write control circuit and a column selection circuit are arranged on two adjacent sides of a plurality of memory modules as a whole, respectively, to solve an RC delay problem and make a chip design more flexible.

In order to make the objectives, technical solutions and advantages of the embodiments of the present disclosure clearer, the embodiments of the present disclosure are described in detail below with reference to the drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
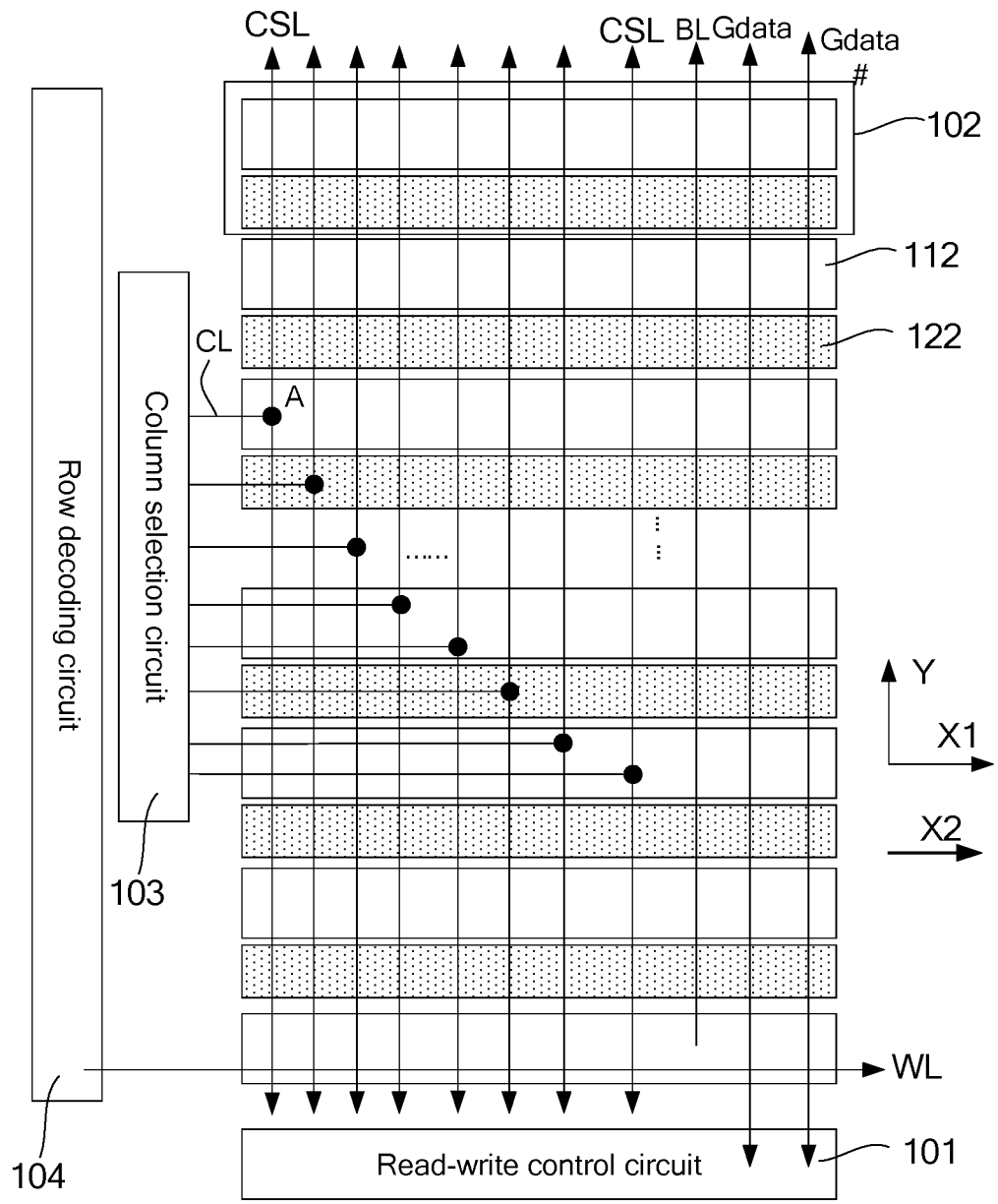
FIG. 2 is a schematic structural diagram of a memory according to some embodiments of the present disclosure.
Figure 3:
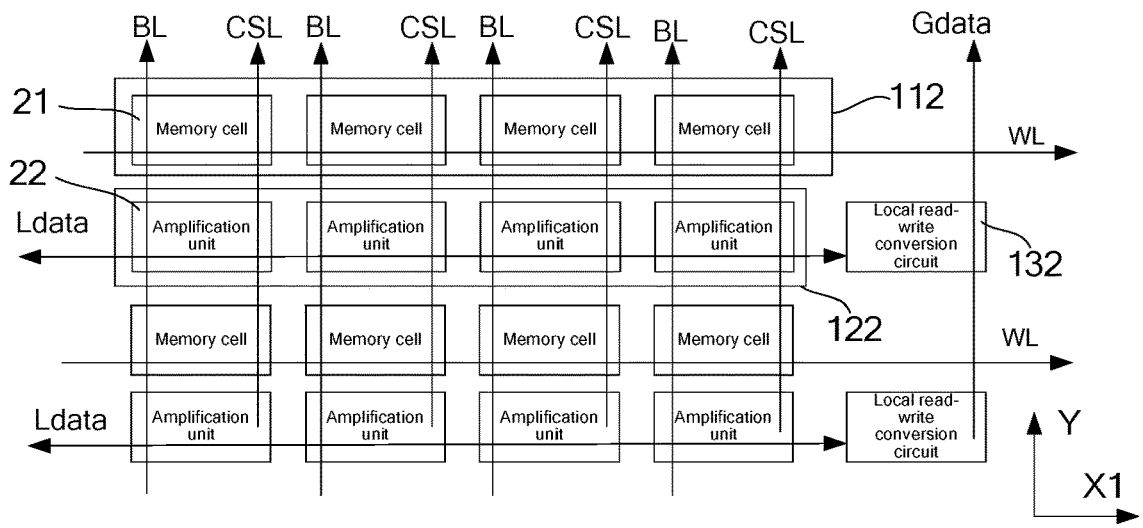
FIG. 3 is a schematic structural diagram of a memory array of a memory according to some embodiments of the present disclosure.
Figure 4:
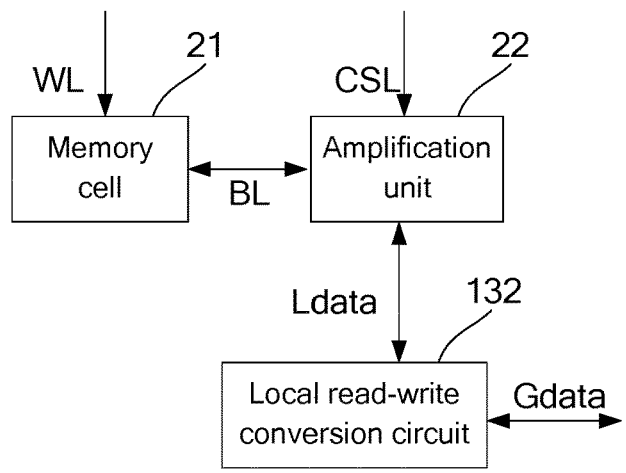
FIG. 4 is a schematic diagram of a circuit structure of an amplification unit and a memory cell of a memory according to some embodiments of the present application.
Figure 5:
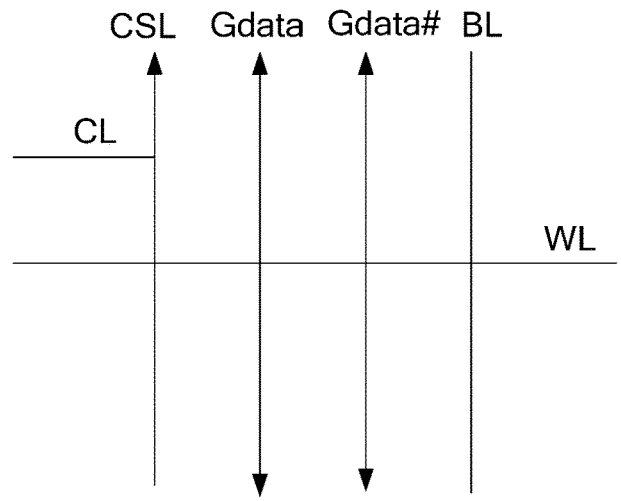
FIG. 5 is a schematic layout diagram of data lines in a memory according to some embodiments of the present disclosure.

FIG. 2 is a schematic structural diagram of a memory according to some embodiments of the present disclosure, FIG. 3 is a schematic structural diagram of a memory array in a memory according to some embodiments of the present disclosure, FIG. 4 is a schematic diagram of a circuit structurer of an amplification unit and a memory cell in a memory according to some embodiments of the present disclosure, FIG. 5 is a schematic layout diagram of data lines in a memory according to some embodiments of the present disclosure, and FIG. 6 to FIG. 12 are structural diagrams of a memory according to some embodiments of the present disclosure. It can be understood that the memory cell described herein refers to an array unit formed by a plurality of basic memory cells that each are composed of a capacitor and a transistor.

Referring to FIG. 2 and FIG. 3, a memory provided in an embodiment of the present disclosure includes: BLs extending along a first direction Y and WLs extending along a second direction X1; a read-write control circuit 101 and a plurality of memory modules 102 that are arranged along the first direction Y, wherein each of the plurality of memory modules 102 includes a memory array 112 and an amplifier array 122 that are arranged along the first direction Y, the memory array 112 includes at least one memory cell 21, the amplifier array 122 includes at least one amplification unit 22, each of the BLs is electrically connected to a first terminal of a corresponding amplification unit 22, and each of the WLs is electrically connected to a corresponding memory cell 21; a column selection circuit 103, wherein the column selection circuit 103 and the read-write control circuit 101 are located on two adjacent sides of the plurality of memory modules 102 as a whole, respectively; m CSLs extending along the first direction Y, wherein each of the CSLs is electrically connected to a control terminal of the amplification unit 22 arranged along the first direction Y, and m is a positive integer greater than 1; and n electrical CLs extending along a third direction X2, wherein each of the electrical CLs is configured to electrically connect the column selection circuit 103 and a corresponding CSL, n is a positive integer greater than 1, and n≤m.

In some embodiments, the column selection circuit and a row decoding circuit of the plurality of memory modules may be located on a same side, and the read-write control circuit is located on another side of the plurality of memory modules. As shown in FIG. 2, the column selection circuit 103 and the row decoding circuit 104 of the plurality of memory modules 102 may be located on a left side of the plurality of memory modules 102, and the read-write control circuit 101 is located on a lower side of the plurality of memory modules 102. In other embodiments, the column selection circuit, the row decoding circuit, and the read-write control circuit may be located different sides of the plurality of memory modules. For example, the column selection circuit may be located on a left side of the plurality of memory modules, the row decoding circuit may be located on a right side of the plurality of memory modules, and the read-write control circuit may be located on a lower side of the plurality of memory modules.

It should be noted that only one BL and one WL are shown in FIG. 2. In fact, the memory includes a plurality of BLs and a plurality of WLs. In FIG. 3, only one BL and CSL are shown in one memory cell. In fact, a plurality of BLs and a plurality of CSLs are connected in one memory cell.

In the above embodiment, the column selection circuit 103 and the read-write control circuit 101 are located on the two adjacent sides of the plurality of memory modules 102 as a whole, respectively, such that a shape and a size of the memory can be adjusted more flexibly and manufacturing efficiency can be optimized. Moreover, a difference between time at which a column selection signal transmitted by a same CSL reaches different amplification units 22 can be reduced, so as to solve an RC delay problem and improve a read-write speed. In addition, in the above memory, different CSLs have an opportunity to transmit a same column selection signal through the electrical CL, that is, the column selection circuit 103 does not need to provide a circuit structure separately for each of the CSLs. This can reduce structural complexity of the column selection circuit 103, a size of the column selection circuit 103, chip area of the memory.

In some embodiments, the memory may be a DRAM, for example, a DDR4 DRAM or a DDR5 DRAM. In other embodiments, the memory may alternatively be an SRAM, an NAND memory, an NOR memory, an FeRAM, or a PcRAM.

Referring to FIG. 3, FIG. 3 is a schematic structural diagram of the memory array 112 in FIG. 2. The memory array 112 may include a plurality of memory cells 21 arranged along the second direction X1, and the amplifier array 122 may include a plurality of amplification units 22 arranged along the second direction X1. In some embodiments, each of the plurality of amplification units 22 may be electrically connected to one memory cell 21 in a same memory module 102 to amplify data read from the memory cell 21 during a read operation. In other embodiments, each of the plurality of amplification units 22 may alternatively be electrically connected to one memory cell 21 in an adjacent memory module 102 to amplify data read from the memory cell 21 during a read operation. It can be understood that this embodiment of the present disclosure does not particularly limit an electrical connection correspondence between the memory cell and the amplification unit in the memory module, provided that the amplification unit can amplify the data read from the memory cell.

In some embodiments, the memory cell 21 may be a DRAM memory cell.

Referring to FIG. 4, FIG. 4 is a schematic diagram of functional modules of the amplification unit 22 and the memory cell 21. The amplification unit 22 is also referred to as a first sense amplifier (FSA). The amplification unit 22 has the control terminal, a first terminal, and a second terminal. The control terminal is electrically connected to the CSL to receive the column selection signal, the first terminal is electrically connected to the BL, and the second terminal is electrically connected to a local data line Ldata. The memory cell 21 is electrically connected to the WL and the BL. If the WL is enabled, the memory cell 21 electrically connected to the WL can perform a read operation, and data is transmitted between the corresponding memory cell 21 and the BL. Specifically, when the control terminal receives the column selection signal, the first terminal and the second terminal are turned on to transmit the data between the BL and the local data line Ldata.

The BLs are electrically connected to memory cells 21 arranged along the first direction Y in a plurality of memory arrays 112, and a same BL is electrically connected to a column of memory cells 21 arranged along the first direction Y. It can be understood that the BL can be presented as a bus, and the same BL is a same BL bus.

The WLs are electrically connected to memory cells 21 arranged along the second direction X1 in the plurality of memory arrays 112, and a same WL is electrically connected to a row of memory cells 21 arranged along the second direction X1 in a same memory array 112. It can be understood that the WL can be presented as a bus, and the same WL is a same WL bus.

The column selection circuit 103, commonly referred to as a YDEC circuit, is configured to provide the column selection signal for the amplification unit 22 to select the amplification unit 22 to transmit the data between the BL and the local data line Ldata. The CSL is electrically connected to the column selection circuit 103 through the electrical CL.

All amplification units 22 and memory cells 21 that are arranged along the first direction Y can be defined as one section. A quantity of sections in the memory is the same as that of memory cells 21 in the plurality of memory modules 102, and each section includes one memory cell 21 in any memory array. It can be understood that the memory includes a plurality of sections, and the plurality of sections are arranged along the second direction X1, and each of the plurality of sections extends along the first direction Y. Each of the BLs is electrically connected to a memory cell 21 and an amplification unit 22 in a corresponding section, and each of the CSLs is electrically connected to the amplification unit 22 in the corresponding section. The CSL is configured to turn on a plurality of BLs in a same section and a corresponding local data line Ldata. Each of the plurality of sections includes a plurality of CSLs, and may further include a conventional CSL and a redundant CSL. When the memory operates, one CSL in each of the plurality of sections is selected and turned on.

The electrical CL is configured to electrically connect the column selection circuit 103 and the CSL, such that the column selection signal provided by the column selection circuit 103 is transmitted to the CSL through the electrical CL. In some embodiments, the third direction X2 may be the same as the second direction X1, in other words, an extension direction of the electrical CL may be the same as that of the WL, and the first direction Y may be perpendicular to the third direction X2. In this way, a length of the electrical CL can be as short as possible, such that the transmission path of the column selection signal can be as short as possible, which is conducive to further improving read-write performance of the memory.

A connection node between the electrical CL and the CSL is defined as a point A. For any of the CSLs, the column selection signal is transmitted to a plurality of amplification units 22 in a same section on one side of the point A, and the column selection signal is also transmitted to a plurality of amplification units 22 in a same section on another side of the point A. In this way, a difference between time required for transmitting the column selection signal to different amplification units 22 in the same section is small. In particular, a difference between a length of a CSL from the point A to a head-end amplification unit 22 in the same section and a length of a CSL from the point A to a tail-end amplification unit 22 in the same section is small. Therefore, a difference between time required for transmitting the column selection signal to the head-end and tail-end amplification units 22 in the same section is small, which is conducive to solving an RC delay problem when different amplification units 22 in the same section are enabled.

In some embodiments, the column selection circuit 103 can be arranged in the middle of one side of the plurality of memory modules 102, which is conducive to further reducing a difference between time required for transmitting the column selection signal to head-end and tail-end amplification units 22 in each section, so as to further improve overall performance of the memory.

In some embodiments, the memory may further include local data lines (not shown in the figure). Each of the local data lines extends along the second direction X1, and a same local data line is electrically connected to second terminals of amplification units 22 in a same amplifier array 122. It can be understood that one amplifier array 122 may be connected to a plurality of local data lines.

In some embodiments, the memory may further include complementary BLs, and a signal phase of each of the complementary BLs is opposite to a signal phase of the BL. Accordingly, the memory may further include local complementary data lines, and a signal phase of each of the local complementary data lines is opposite to a signal phase of the local data line.

In some embodiments, the memory may further include a global data line Gdata extending along the first direction Y. A same global data line Gdata can be electrically connected to a plurality of local data lines. Specifically, the same global data line Gdata can be electrically connected to all local data lines. The global data line Gdata can have smaller resistance and parasitic capacitance than the local data line. The memory may further include a global complementary data line Gdata# extending along the first direction Y. A signal phase of the global complementary data line Gdata# is opposite to that of the global data line Gdata.

In some embodiments, referring to FIG. 3 and FIG. 4, the memory module 102 may further include a local read-write conversion circuit (Lrwap) 132, and the local read-write conversion circuit 132 is electrically connected to the second terminal of the amplification unit 22. Specifically, the local read-write conversion circuit 132 is electrically connected to the second terminal of the amplification unit 22 through the local data line. The local read-write conversion circuit 132 is configured to implement data transmission between the local data line and the global data line. More specifically, a same global data line can be electrically connected to a plurality of local read-write conversion circuits 132.

Referring to FIG. 3, the local read-write conversion circuit 132 may be arranged on one side of the amplifier array 122, and the local read-write conversion circuit 132 of each of the plurality of memory modules 102 is arranged on a same side of a corresponding amplifier array 122. In this way, a length of the global data line Gdata can be reduced and the read-write speed can be improved. In other embodiments, the local read-write conversion circuit 132 may be arranged inside the amplifier array 122, in other words, arranged between any adjacent amplification units 22, and local read-write conversion circuits 132 of different memory modules 102 are arranged in a same position of corresponding amplifier arrays 122. For example, the local read-write conversion circuit 132 of each of the plurality of memory modules 102 is arranged between a fifth amplification unit 22 and a sixth amplification unit 22, or the local read-write conversion circuit 132 of each of the plurality of memory modules 102 is arranged between a tenth amplification unit 22 and an eleventh amplification unit 22.

Referring to FIG. 5, FIG. 5 is a schematic layout diagram of data lines in the memory according to this embodiment of the present disclosure. It should be noted that only one line is shown for each type of data line in FIG. 5.

In some embodiments, referring to FIG. 2, the memory may further include the row decoding circuit 104. The row decoding circuit 104 is electrically connected to the WL through a row selection line to provide a row decoding signal for the WL to select the WL, such that the memory cell 21 electrically connected to the WL performs read and write operations, or to select the memory cell 21 electrically connected to the WL. Specifically, the row decoding circuit 104 and the column selection circuit 103 may be located on a same side of the plurality of memory modules 102.

In some embodiments, the row decoding circuit 104 and the column selection circuit 103 may be located at a same layer of the memory. In other embodiments, the row decoding circuit 104 and the column selection circuit 103 may be located at different layers of the memory. For example, in a semiconductor structure of the memory, the row decoding circuit 104 and the column selection circuit 103 may be formed by a same semiconductor material layer and/or metal layer, or by different semiconductor material layers and/or metal layers.

In some embodiments, referring to FIG. 2, each of the CSLs may be electrically connected to control terminals of a plurality of columns of amplification units 22 arranged along the first direction Y. In other words, each of the CSLs is electrically connected to control terminals of a plurality of amplification units 22 arranged along the first direction Y in a same section.

Figure 6:
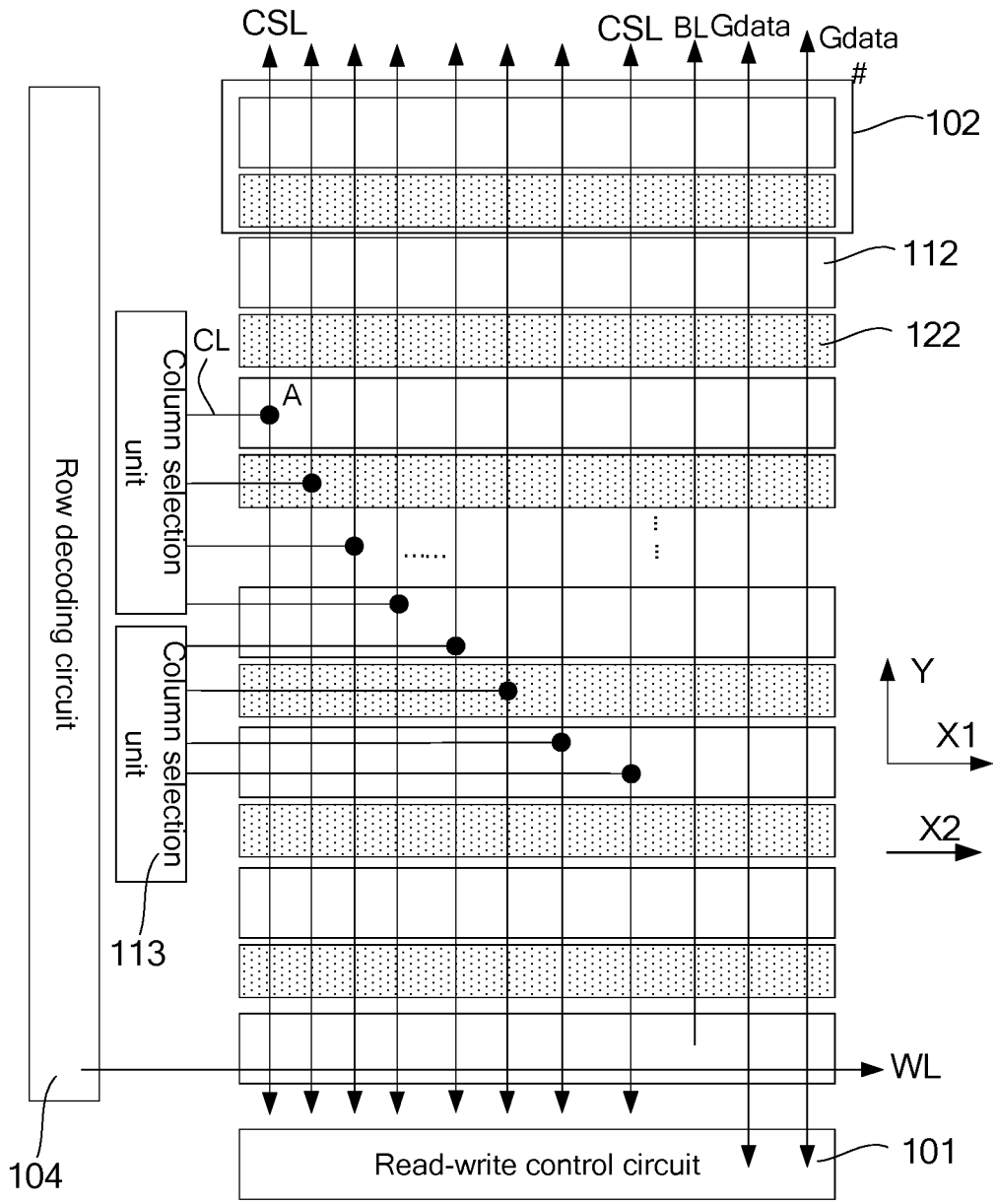
FIG. 6 is a first schematic structural diagram of a memory according to some embodiments of the present disclosure.
Figure 7:
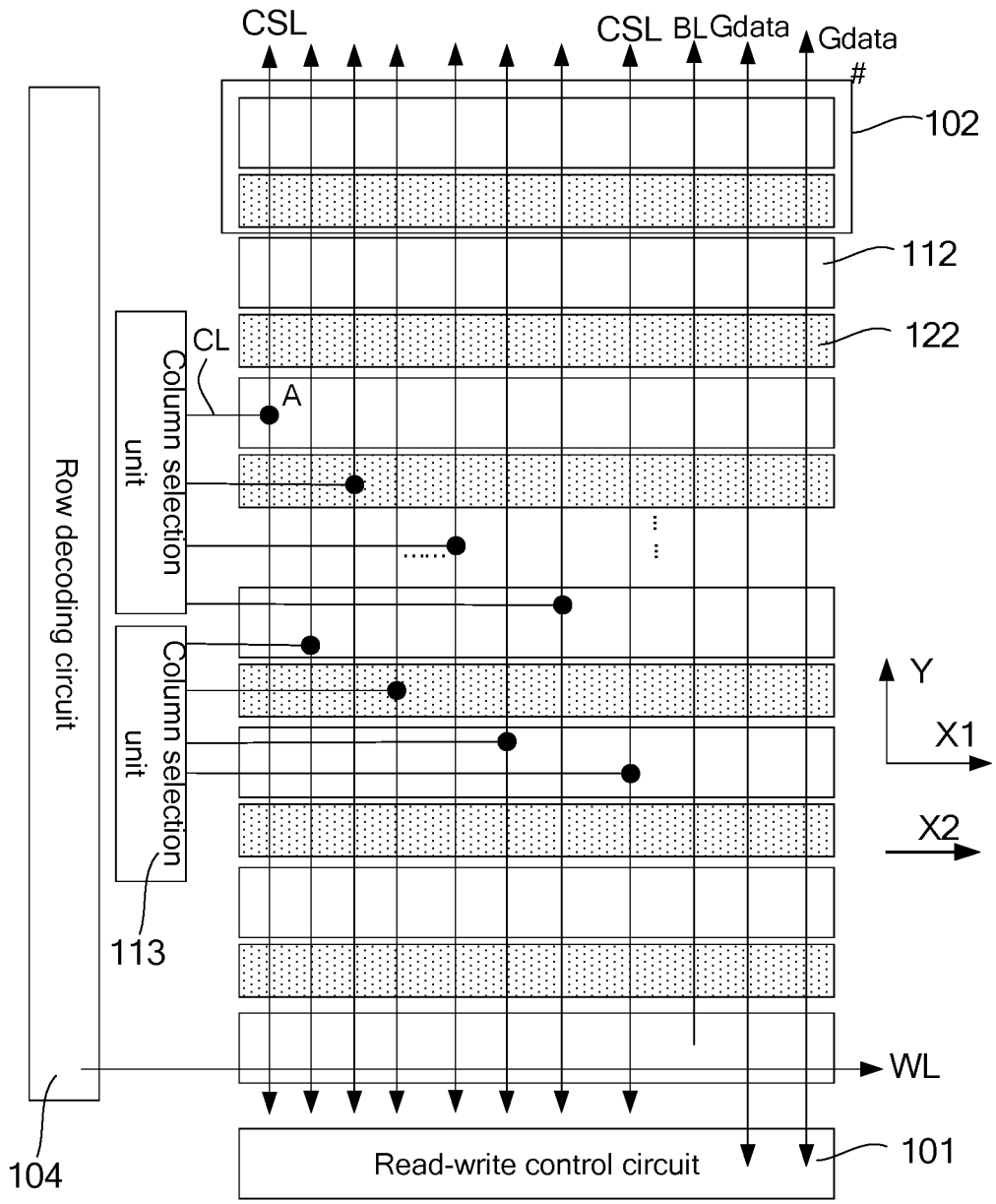
FIG. 7 is a second schematic structural diagram of a memory according to some embodiments of the present disclosure.

In some embodiments, referring to FIG. 6 and FIG. 7, FIG. 6 and FIG. 7 are different schematic structural diagrams of the memory according to this embodiment of the present disclosure. The column selection circuit 103 may include a plurality of column selection units 113 arranged along the first direction Y, and each of the plurality of column selection units 113 is electrically connected to at least two of the CSLs through the electrical CL. In this way, a plurality of CSLs can share one column selection unit 113, and amplification units 22 connected to a plurality of CSLs can be driven by a same column selection unit 113. This can reduce circuit complexity of the column decoding circuit 103 and the chip area.

Referring to FIG. 6, in some embodiments, each of the plurality of column selection units 113 may be electrically connected to at least two adjacent CSLs through the electrical CL. In this way, a same column selection unit 113 can be configured to turn on BLs in adjacent sections, and amplification units 22 in different sections can share one column selection unit 113, which is conducive to reducing a quantity of column selection units 113 and the chip area. Each of the plurality of column selection units 113 may be electrically connected to at least two of the CSLs through a same electrical CL; or each of the plurality of column selection units 113 may be electrically connected to at least two of the CSLs through different electrical CLs.

Referring to FIG. 7, each of the plurality of column selection units 113 may alternatively be electrically connected to at least two CSLs distributed at intervals, through the electrical CL. In this way, a same column selection unit 113 can be used to enable amplification units 22 in sections distributed at intervals, which is conducive to reducing a quantity of decoding units 113 and the chip area. Moreover, the CSLs distributed at intervals are electrically connected to a same column selection unit 113, which is conducive to avoiding signal interference between different CSLs and further improves the read-write performance of the memory. Each of the plurality of column selection units 113 may be electrically connected to at least two of the CSLs through a same electrical CL; or each of the plurality of column selection units 113 may be electrically connected to at least two of the CSLs through different electrical CLs.

In some embodiments, with reference to FIG. 3 and FIG. 8 to FIG. 12, wherein FIG. 8 to FIG. 12 are different schematic structural diagrams of the memory according to some embodiments of the present disclosure, the plurality of memory modules 102 may be divided into at least two module regions I arranged along the first direction Y, and each of the at least two module regions I includes a plurality of memory modules 102; and the column selection circuit 103 includes: at least two column selection modules 130 arranged along the first direction Y, wherein each of the at least two column selection modules 130 is electrically connected to a corresponding CSL through the electrical CL, and each of the CSLs is electrically connected to a control terminal of an amplification unit (not shown in the figure) in a corresponding module region I. It should be noted that FIG. 8 to FIG. 12 do not show the amplifier array, the memory cell, the amplification unit, the WL, or the BL, and only show the memory array in a form of a box, and an amplifier array between adjacent memory arrays is not shown. For arrangement of the amplifier array, the memory cell, the amplification unit, the WL, and the BL, reference may be made to the corresponding description in FIG. 2 to FIG. 7.

Specifically, each of the at least two module regions I contains a same quantity of memory modules 102. In addition, the memory may further be divided into a high-bit address memory bank U and a low-bit address memory bank V. The high-bit address memory bank U and the low-bit address memory bank V each include a plurality of memory modules 102.

Memory cells 21 in different module regions I are connected to different WLs, in other words, a WL in a module region I is enabled while WLs in other module regions I are not enabled. In this case, because different module regions I have mutually independent CSLs, only a CSL corresponding to a module region I corresponding to an enabled WL can be selected to transmit the column selection signal, while CSLs corresponding to other module regions I may not be used to transmit the column selection signal, which can reduce more power consumption. Moreover, compared with a scheme in which each of the CSLs is electrically connected to amplification units in all module regions, a scheme in which each of the at least two module regions I has an independent CSL can reduce the length of each of the CSLs, which is conducive to reducing resistance of the CSL. Moreover, load on each of the CSLs is reduced, which is conducive to reducing a heat loss and power consumption. It can be understood that the load includes the amplification unit electrically connected to the CSL.

Figure 8:
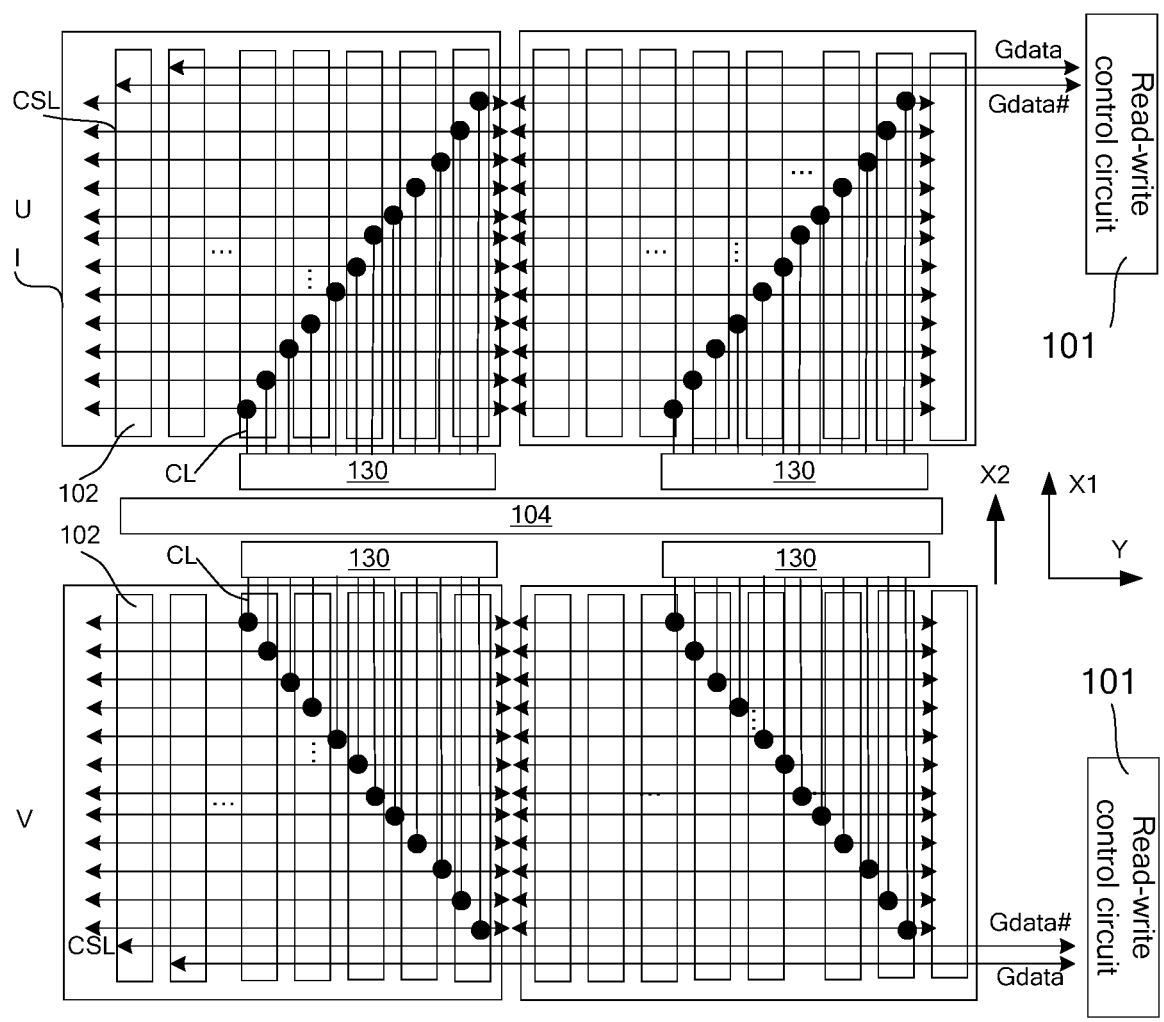
FIG. 8 is a third schematic structural diagram of a memory according to some embodiments of the present disclosure.
Figure 10:
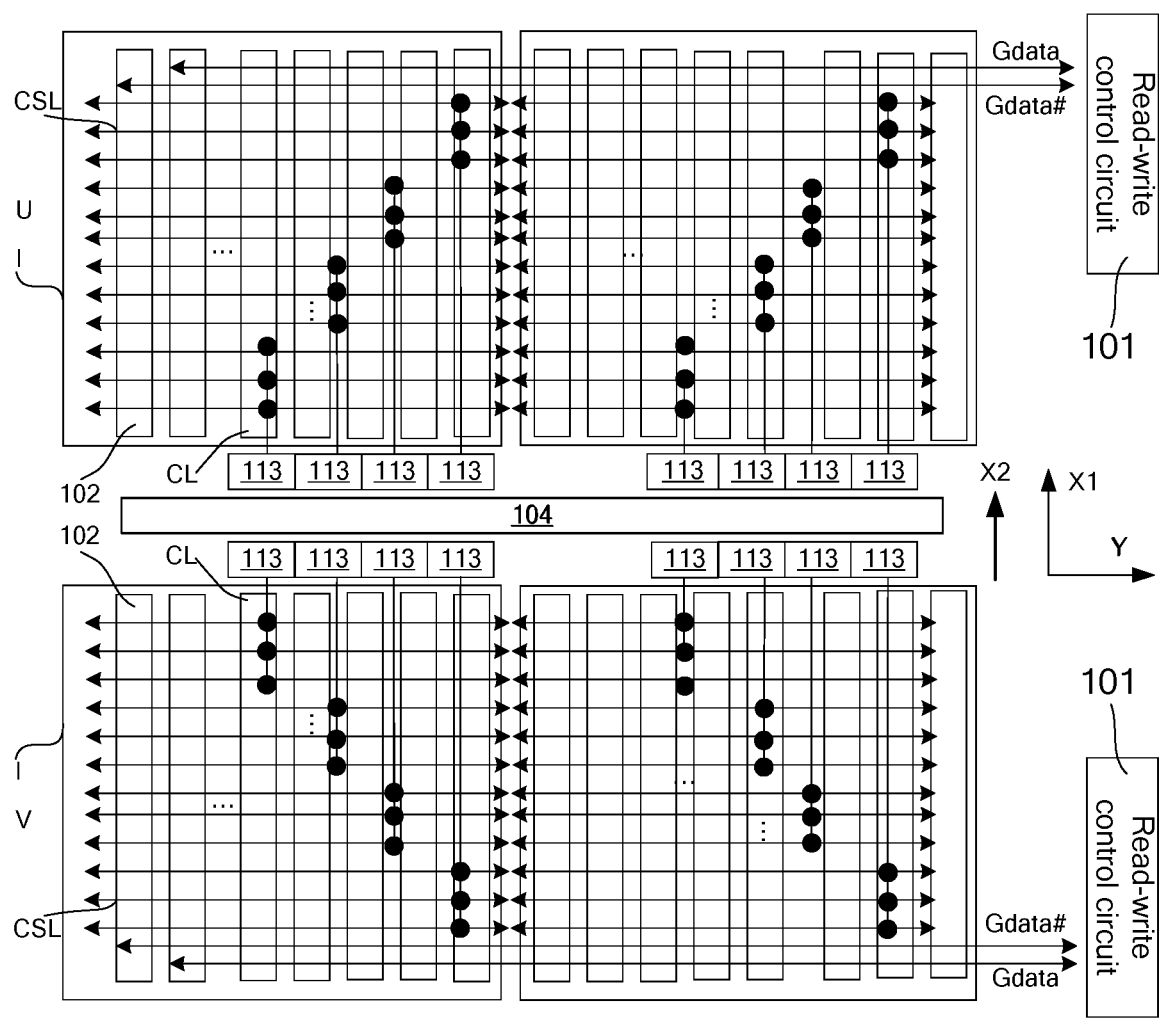
FIG. 10 is a fifth schematic structural diagram of a memory according to some embodiments of the present disclosure.

As shown in FIG. 8, in some embodiments, there may be two module regions I. As shown in FIG. 10, in other embodiments, there may alternatively be three module regions I. It can be understood that a quantity of module regions I may be reasonably set based on an actual situation, and the quantity of module regions I is not limited in this embodiment of the present disclosure.

In some embodiments, the column selection circuit 103 may be configured to: when a WL corresponding to the module region I is enabled, the column selection module 130 corresponding to the module region I provides the column selection signal for the corresponding CSL through the electrical CL.

Figure 9:
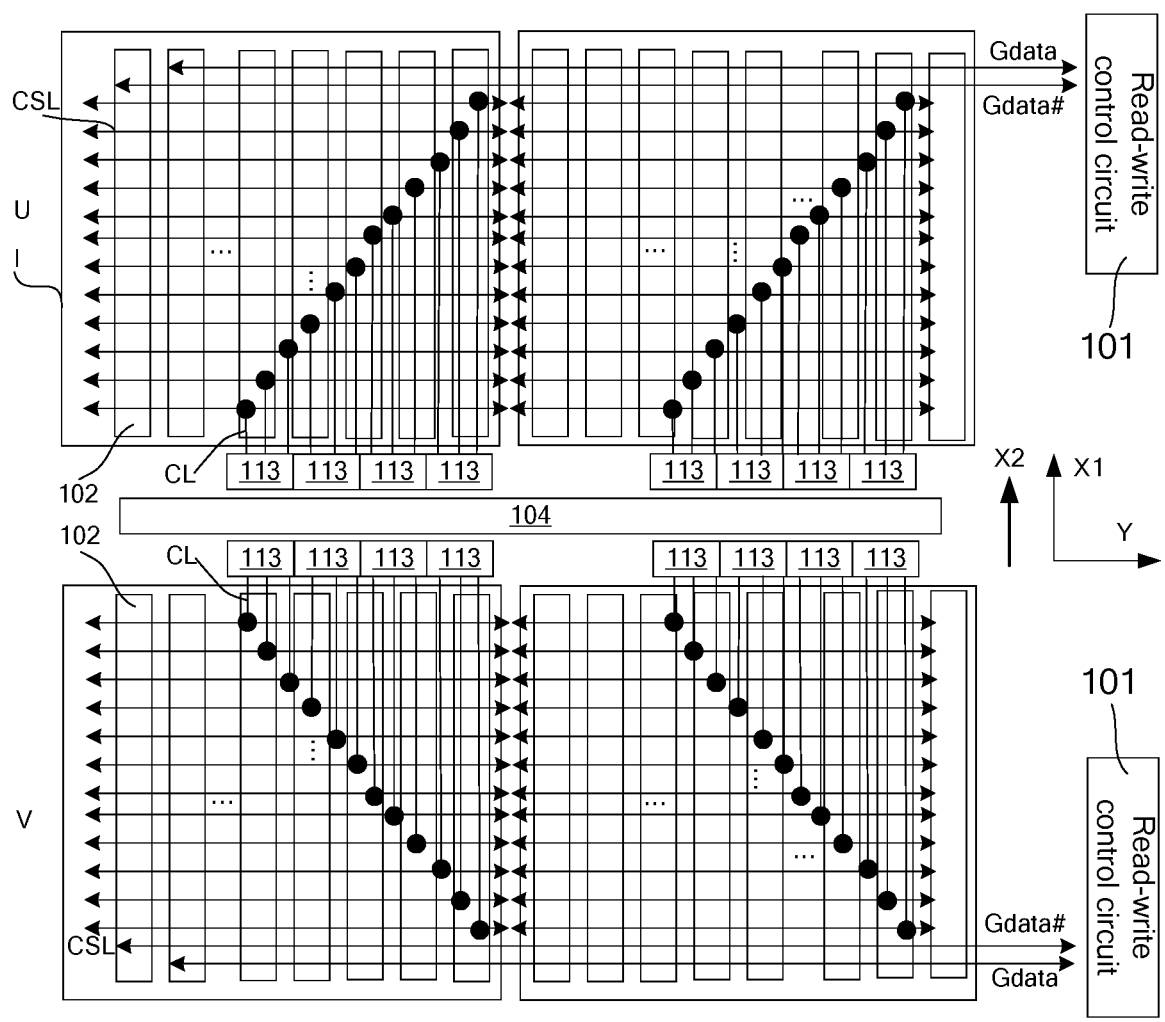
FIG. 9 is a fourth schematic structural diagram of a memory according to some embodiments of the present disclosure.
Figure 11:
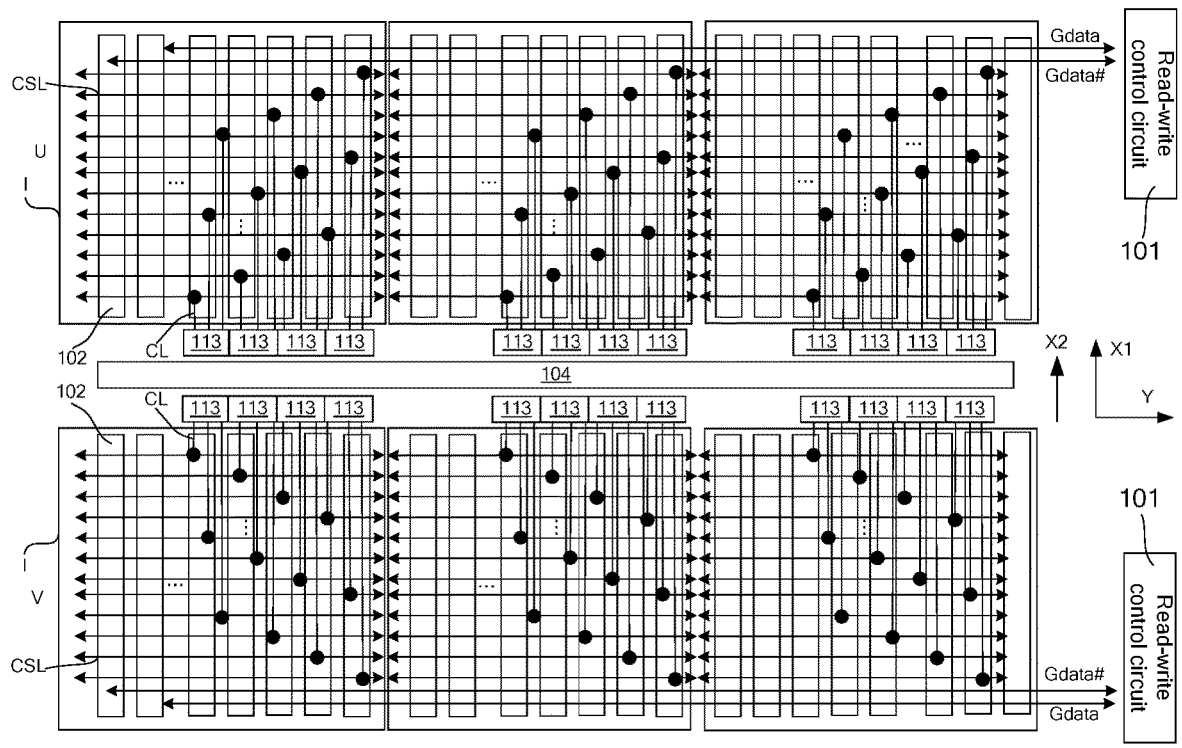
FIG. 11 is a sixth schematic structural diagram of a memory according to some embodiments of the present disclosure.

Referring to FIG. 8, FIG. 9, and FIG. 11, in some embodiments, for a same module region I, a quantity of electrical CLs is the same as that of CSLs, and each of the electrical CLs is electrically connected to one of the CSLs.

Figure 12:
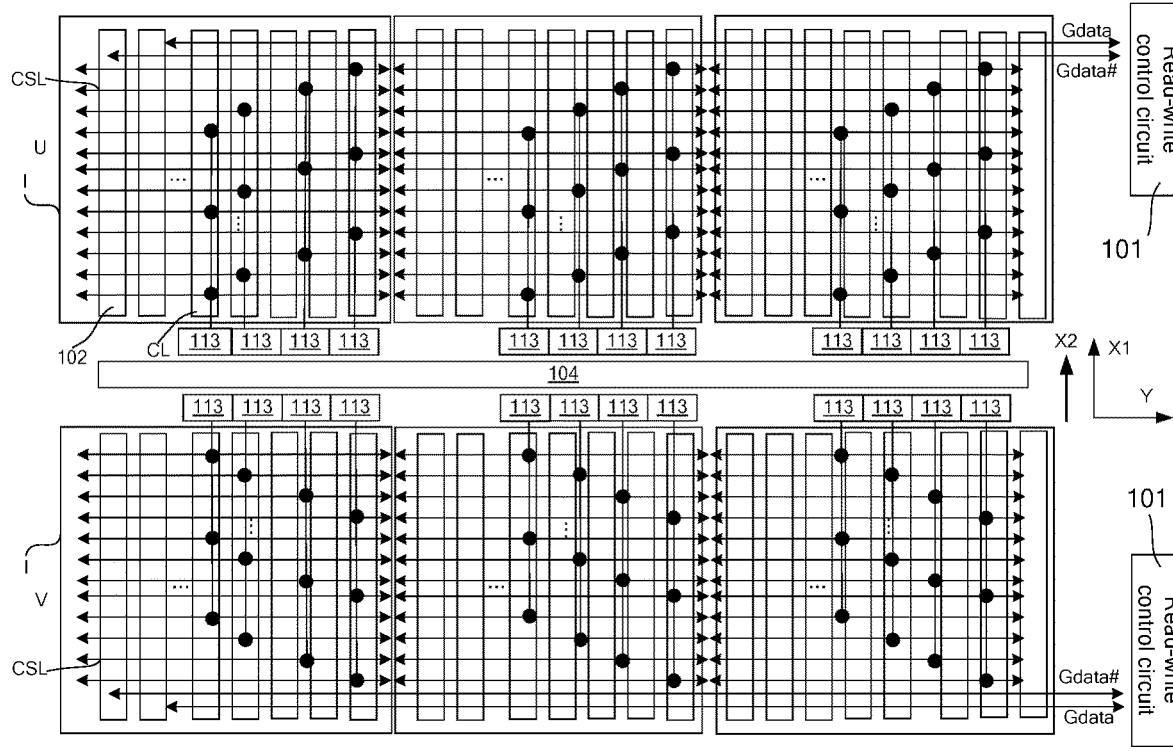
FIG. 12 is a seventh schematic structural diagram of a memory according to some embodiments of the present disclosure.

Referring to FIG. 10 and FIG. 12, in some embodiments, for a same module region I, a same electrical CL is electrically connected to at least two of the CSLs, in other words, a quantity of electrical CLs is less than that of CSLs. In this way, different CSLs can be electrically connected to a same electrical CL, in other words, BLs corresponding to different sections can select the column selection signal through a same CSL. This is helpful to reduce circuit complexity of the corresponding column selection circuit 103 and the chip area.

Referring to FIG. 9 to FIG. 12, the column selection module 130 may include at least two column selection units 113 arranged in the first direction Y, and each of the at least two column selection units 113 is electrically connected to at least two of the CSLs through the electrical CL, in other words, the quantity of electrical CLs is less than that of CSLs. In this way, amplification units in different sections can share a same column selection signal.

It should be noted that, in other embodiments, each of the at least two column selection units may alternatively be electrically connected to one CSL through an independent electrical CL.

In some embodiments, referring to FIG. 9 and FIG. 10, for a same module region I, each of the at least two column selection units 113 may be electrically connected to at least two adjacent CSLs through the electrical CL, in other words, each of the at least two column selection units 113 can enable amplification units in adjacent sections of the same module region I. In this way, the adjacent sections can share the same column selection unit 113, which is conducive to reducing the quantity of column selection units 113 and the chip area.

Referring to FIG. 9, each of the at least two column selection units 113 may be electrically connected to at least two adjacent CSLs through different electrical CLs. Referring to FIG. 10, each of the at least two column selection units 113 may alternatively be electrically connected to at least two adjacent CSLs through a same electrical CL.

In some embodiments, referring to FIG. 11 and FIG. 12, there may be three module regions I. For a same module region I, each of the at least two column selection units 113 may be electrically connected to at least two CSLs distributed at intervals, through the electrical CL, in other words, each of the at least two column selection units 113 can enable amplification units in sections distributed at intervals in the same module region I. This can prevent a too small distance between CSLs transmitting a same column selection signal, so as to avoid signal crosstalk.

Referring to FIG. 11, each of the at least two column selection units 113 may be electrically connected to at least two CSLs distributed at intervals, through different electrical CLs. Referring to FIG. 12, each of the at least two column selection units 113 may alternatively be electrically connected to at least two CSLs distributed at intervals, through a same electrical CL.

It can be understood that a specific manner in which the column selection unit 113 is electrically connected to the CSL through the electrical CL may be a combination of any types of manners described above. A combination manner of an electrical connection between the electrical CL and the CSL is not limited in this embodiment of the present disclosure.

An embodiment of the present disclosure provides a memory with a superior structure and superior performance. A column selection circuit 103 and a row decoding circuit 104 are arranged on a same side of a plurality of memory modules 102, which makes a chip design of the memory more flexible, helps to reduce chip area, and reduces time required for transmitting a column selection signal to an amplification unit 22 far away from a read-write control circuit 101. This is conducive to solving an RC delay problem and improving read-write performance of the memory.

Those skilled in the art can understand that the above implementations are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

What is claimed is:

1. A memory, comprising:
   bit lines extending along a first direction and word lines extending along a second direction;
   a read-write control circuit and a plurality of memory modules that are arranged along the first direction, wherein each of the plurality of memory modules comprises a memory array and an amplifier array that are arranged along the first direction, the memory array comprises at least one memory cell, the amplifier array comprises a plurality of amplification units, each of the bit lines is electrically connected to a first terminal of a corresponding amplification unit, and each of the word lines is electrically connected to a corresponding memory cell;

a column selection circuit, wherein the column selection circuit and the read-write control circuit are located on two adjacent sides of the plurality of memory modules, respectively;

m column-select lines extending along the first direction, wherein each of the column-select lines is electrically connected to control terminals of a plurality of columns of the amplification units arranged along the first direction, and m is a positive integer greater than 1; and n electrical connection lines extending along a third direction, wherein each of the electrical connection lines is configured to electrically connect the column selection circuit and a corresponding column-select line, n is a positive integer greater than 1, and n≤m;

wherein the column selection circuit comprises a plurality of column selection units arranged along the first direction, and each of the plurality of column selection units is electrically connected to at least two of the column-select lines through the electrical connection line.

2. The memory according to claim 1, wherein each of the plurality of column selection units is electrically connected to at least two adjacent ones of the column-select lines through the electrical connection line.

3. The memory according to claim 1, wherein each of the plurality of column selection units is electrically connected to at least two ones distributed at intervals of the column-select lines through the electrical connection line.

4. The memory according to claim 1, wherein each of the plurality of column selection units is electrically connected to at least two of the column-select lines through a same electrical connection line; or each of the plurality of column selection units is electrically connected to at least two of the column-select lines through different electrical connection lines.

5. A memory, comprising:
bit lines extending along a first direction and word lines extending along a second direction;
a read-write control circuit and a plurality of memory modules that are arranged along the first direction, wherein each of the plurality of memory modules comprises a memory array and an amplifier array that are arranged along the first direction, the memory array comprises at least one memory cell, the amplifier array comprises a plurality of amplification units, each of the bit lines is electrically connected to a first terminal of a corresponding amplification unit, and each of the word lines is electrically connected to a corresponding memory cell;
a column selection circuit, wherein the column selection circuit and the read-write control circuit are located on two adjacent sides of the plurality of memory modules, respectively;
m column-select lines extending along the first direction, wherein each of the column-select lines is electrically connected to control terminals of a plurality of columns of the amplification units arranged along the first direction, and m is a positive integer greater than 1; and
n electrical connection lines extending along a third direction, wherein each of the electrical connection lines is configured to electrically connect the column selection circuit and a corresponding column-select line, n is a positive integer greater than 1, and n≤m;
wherein the plurality of memory modules are divided into at least two module regions arranged along the first direction, and each of the at least two module regions comprises a plurality of memory modules; and
the column selection circuit comprises:
at least two column selection modules arranged along the first direction, wherein each of the at least two column selection modules is located on one side of a corresponding module region, and is electrically connected to a corresponding column-select line through the electrical connection line, and each of the column-select lines is electrically connected to the control terminal of the amplification unit in the corresponding module region.

6. The memory according to claim 5, wherein the column selection circuit is configured to: when one of the word lines corresponding to the module region is enabled, the column selection module corresponding to the module region provides a column selection signal for the corresponding column-select line through the electrical connection line.

7. The memory according to claim 5, wherein for a same module region, a quantity of the electrical connection lines is the same as a quantity of the column-select lines, and each of the electrical connection lines is electrically connected to one of the column-select lines.

8. The memory according to claim 5, wherein for a same module region, a same electrical connection line is electrically connected to at least two of the column-select lines.

9. The memory according to claim 5, wherein the column selection module comprises at least two column selection units arranged along the first direction, and each of the at least two column selection units is electrically connected to at least two of the column-select lines through the electrical connection line.

10. The memory according to claim 9, wherein for a same module region, each of the at least two column selection units is electrically connected to at least two adjacent ones of the column-select lines through the electrical connection line.

11. The memory according to claim 9, wherein for a same module region, each of the at least two column selection units is electrically connected to at least two ones distributed at intervals of the column-select lines through the electrical connection line.

12. The memory according to claim 9, wherein each of the at least two column selection units is electrically connected to at least two of the column-select lines through a same electrical connection line; or each of the at least two column selection units is electrically connected to at least two of the column-select lines through different electrical connection lines.

13. The memory according to claim 5, wherein each of the at least two module regions contains a same quantity of the memory modules.

14. The memory according to claim 5, wherein there are three module regions.

15. The memory according to claim 1, wherein the first direction is perpendicular to the third direction; and the second direction is the same as the third direction.

16. The memory according to claim 1, further comprising a row decoding circuit, wherein the row decoding circuit and the column selection circuit are located on a same side of the plurality of memory modules.

* * * * *